United States Patent [19]

Moore

[11] Patent Number: 5,532,905
[45] Date of Patent: Jul. 2, 1996

[54] THERMALLY ENHANCED LEADFRAME FOR PACKAGES THAT UTILIZE A LARGE NUMBER OF LEADS

[75] Inventor: Thomas D. Moore, Limerick, Ireland

[73] Assignee: Analog Devices, Inc., Norwood, Mass.

[21] Appl. No.: 445,037

[22] Filed: May 19, 1995

Related U.S. Application Data

[63] Continuation-in-part of Ser. No. 277,324, Jul. 19, 1994, abandoned.

[51] Int. Cl.$^6$ ............................................. H05K 7/20
[52] U.S. Cl. ........................ 361/723; 257/675; 361/813
[58] Field of Search .................................... 257/666, 668, 257/672, 675, 676, 692–695; 361/704, 707, 717–718, 722, 723, 813; 437/206, 220

[56] References Cited

U.S. PATENT DOCUMENTS

| | | | |
|---|---|---|---|
| 4,714,952 | 12/1987 | Takekawa et al. | 257/676 |
| 4,809,053 | 2/1989 | Kuraishi | 357/70 |
| 5,057,805 | 10/1991 | Kadowaki | 361/813 |
| 5,146,310 | 9/1992 | Bayan et al. | 357/70 |
| 5,332,864 | 7/1994 | Liang et al. | 257/676 |
| 5,334,872 | 8/1994 | Ueda et al. | 257/675 |
| 5,440,170 | 8/1995 | Tsuji et al. | 257/676 |

FOREIGN PATENT DOCUMENTS

| | | | |
|---|---|---|---|
| 3135574 | 11/1978 | Japan | 257/675 |
| 1023351 | 1/1986 | Japan | 257/676 |
| 64-245034 | 9/1987 | Japan | |
| 2-310954 | 12/1990 | Japan | |

Primary Examiner—Gregory D. Thompson
Attorney, Agent, or Firm—Koppel & Jacobs

[57] ABSTRACT

A leadframe that exhibits improved thermal dissipation and that can be incorporated into standard integrated circuit (IC) packages is provided by increasing the thermal cross-section between the leadframe paddle and the lead fingers (leads) so that the leads are utilized for conducting a significant amount of heat away from the IC. A larger thermal cross-section can be achieved by making the shape of the paddle perimeter nonlinear to increase the surface area of its edge. In the preferred embodiment, the paddle perimeter has a "serpentine" shape and the inner ends of the leads are placed in close proximity to the paddle perimeter and are shaped to substantially follow its serpentine shape. The shaped paddle and lead ends increase the thermal cross-section between the paddle and the leads, resulting in improved thermal conduction. The leads conduct the heat to the outside of the package, where it is dissipated into the circuit board on which the leadframe package is mounted. For a package with a large number of leads, the paddle perimeter preferably has a saw-tooth shape, with at least some of the leads positioned between adjacent teeth.

10 Claims, 5 Drawing Sheets

THERMALLY ENHANCED LEADFRAME FOR PACKAGES THAT UTILIZE A LARGE NUMBER OF LEADS

This is a continuation-in-part of application Ser. No. 08/277,324, filed on Jul. 19, 1994, now abandoned.

BACKGROUND OF THE INVENTION

1. Field of the Invention

The present invention relates to the housing and protection of integrated circuit chips. More specifically, the present invention relates to a leadframe structure that offers enhanced thermal dissipation for integrated circuit chips.

2. Description of the Related Art

Modern integrated circuits (ICs) require protection from self-heating effects to operate reliably. One of the methods by which ICs are cooled is heat conduction through the leadframe. The leadframe typically consists of a metallic leadframe paddle on which the IC is mounted and lead fingers for providing electrically conductive paths from the bonding pads of the IC to external elements, such as circuit boards.

An example of a typical leadframe is illustrated in FIG. 1. The IC 10 is typically attached to a leadframe paddle 12. Electrically conductive lead fingers 14 are electrically connected to the IC 10 with wire bonds 16 and serve to provide electrically conductive paths from the IC 10 to external elements (not shown). The leadframe is typically encapsulated in a moulding compound 18.

The typical heat conduction paths are along the leadframe paddle 12 and through the moulding compound 18, which typically has low thermal conductivity. The lead fingers 14 generally do not contribute significantly to the thermal dissipation because of the relatively low thermal conductivity paths between them and the paddle 12.

As IC fabrication technology advances, more power generating elements are incorporated into single ICs, creating a need for mounting packages with increased thermal dissipation properties. One prior leadframe design, described in U.S. Pat. No. 5,146,310 by Bayan et al., improves thermal dissipation by connecting the paddle to four thermally conductive pins and also increasing the surface area of the leadframe paddle. The paddle pins allow the paddle to be connected to external heat sinks, such as a ground plane on a circuit board. Although the Bayan leadframe design increases thermal dissipation over standard leadframes, the pin count is increased by up to four relative to a standard package. In order to incorporate the Bayan design into low pin count packages, such as 8-lead dual in-line plastic (DIP) or 8-lead small outline integrated circuit (SOIC) packages, the package dimensions must be increased by up to 50 percent to accommodate the additional paddle pins. As a result, these packages must be redesigned to accommodate the Bayan leadframe structure, and are not pin-compatible with the standard leadframe.

Another leadframe structure, described in Japanese Patent Application No. 2-310954 by Isao Sasahara, increases thermal dissipation by placing the inner ends of the lead fingers in close proximity to the leadframe paddle and branching the outer ends of the lead fingers so that a portion of each lead finger is attached to a thermally conductive sheet positioned on top of the IC package. Although the Sasahara structure improves thermal dissipation over standard leadframe structures, additional tooling is required to trim and form the lead fingers after the leadframe has been encapsulated in the moulding compound and additional manufacturing steps are required to apply the thermally conductive sheet to the top of the IC package.

A third leadframe structure, described in Japanese Patent Application No. 64-86545 by Nakamura et al., extends portions of the leadframe paddle into the space between the lead fingers to electrically shield the lead fingers from each other. A side benefit of this design is increased dissipation of heat into the moulding compound as a result of the increased surface area of the paddle. However, thermal conduction between the paddle and lead fingers is not greatly improved in this design because the paddle extensions are made narrow in order to extend them between each and every pair of lead fingers. Relatively little heat can flow into these extensions because a narrow paddle extension has a higher thermal resistance than a broad paddle extension. As a result, relatively little heat is available in the extensions to transfer into the leads.

SUMMARY OF THE INVENTION

In view of the limitations of prior leadframe structures, the present invention provides a leadframe that exhibits improved thermal dissipation and that can be incorporated in standard outline packages.

These improvements are achieved by increasing the area of the thermal cross-section between the leadframe paddle and the lead fingers (leads) so that the leads are utilized, to a greater extent than prior leadframes, for conducting heat away from the IC. A larger thermal cross-section is achieved by making the shape of the paddle perimeter nonlinear. The nonlinear shape increases the surface area of the perimeter edge. In the preferred embodiment, a "serpentine-shaped" paddle perimeter is used. The inner ends of the lead fingers are placed in close proximity to the paddle perimeter and are shaped to substantially follow its serpentine shape. The shaped paddle perimeter and lead ends increase the area of the thermal cross-section and simultaneously reduce the distance between the paddle and the leads, resulting in improved thermal conduction between them. The leads conduct the heat to the outside of the package, where it is dissipated into the circuit board on which the leadframe package is mounted.

In a second embodiment, a paddle with a saw-tooth shaped perimeter is used. The leads are positioned so that the inner end of at least one of the leads extends between the "teeth" of the saw-tooth shaped paddle perimeter (these leads are termed "inside leads"). Heat is efficiently conducted to the inside leads as a result of their perimeters being close to and parallel to the paddle perimeter. Heat is conducted from the inside leads to the adjacent leads outside the sawtooth paddle perimeter by virtue of their close proximity to each other. This embodiment is particularly suitable for leadframes with a large number of leads, such as a 160-lead Quad Flat Pack (QFP).

In contrast to prior thermally enhanced leadframe structures, the present leadframe structure utilizes the existing leads of a leadframe to conduct a significant amount of heat away from the IC. Since the number of leads is not increased, the thermally efficient leadframe structure can be incorporated into existing IC package designs without increasing the size or lead count of the IC package.

Unlike some of the prior thermally enhanced leadframes, the present leadframe structure does not require additional thermally conductive components, such as thermally conductive sheets. As a result, additional manufacturing steps and tools are not required for either the leadframe or the IC assembly.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
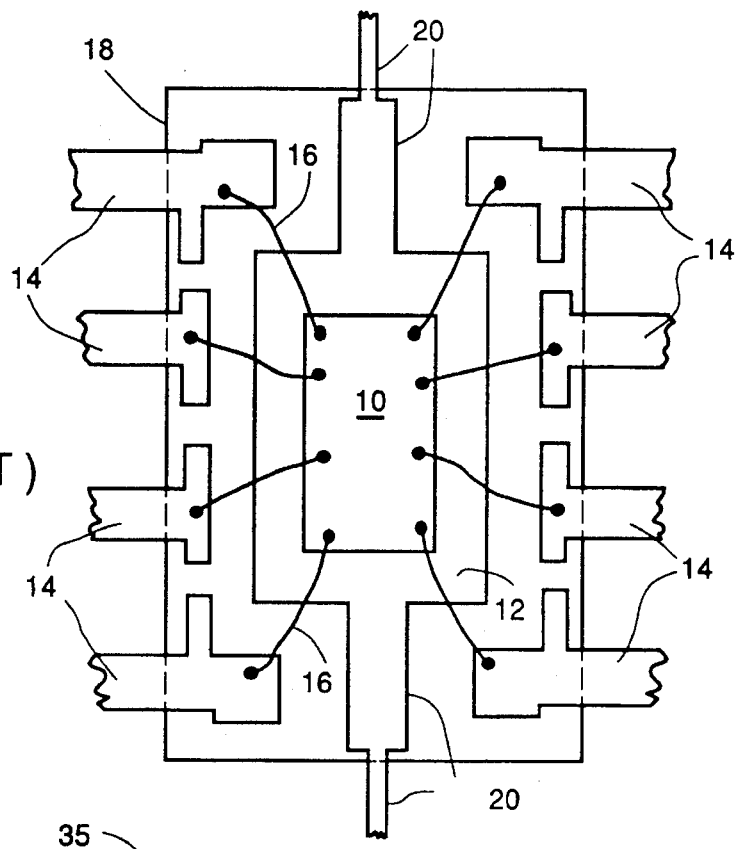
FIG. 1, described above, is a sectional plan view of a typical leadframe.
Figure 2:
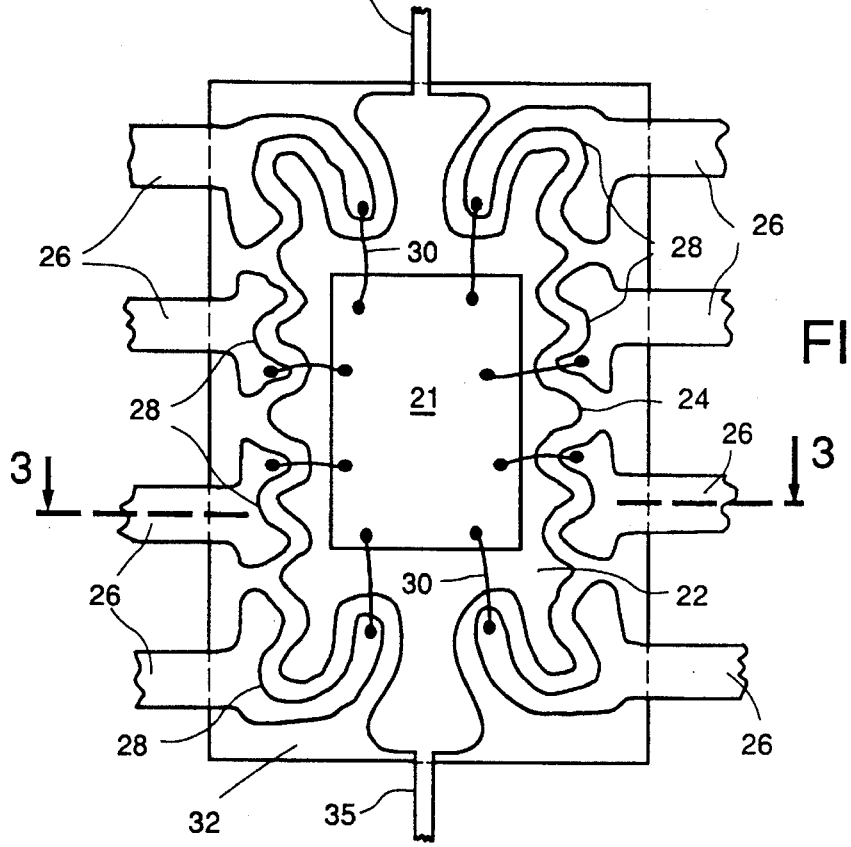
FIG. 2 is a sectional plan view of an 8-lead P-DIP leadframe incorporating the thermally enhanced paddle and lead finger structure of the present invention.

FIG. 2 illustrates an 8-lead P-DIP package with the leadframe paddle and lead finger structure of the present invention. The leadframe paddle 22 on which an IC 21 is disposed is designed with a nonlinear "serpentine-shaped" perimeter 24 that has a greater perimeter edge surface area than a standard rectangular shaped paddle.

Leads 26 are designed so that their inner ends 28 are in close proximity to and substantially follow the shape of the paddle perimeter 24. This causes the inner lead ends 28 to substantially mesh with the serpentine-shaped paddle perimeter. The distance between the lead ends 28 and the paddle perimeter 24 is dictated by the resolution of the manufacturing process used to make the leadframe. The lead ends 28 are preferably placed as close to the paddle perimeter 24 as the manufacturing process will allow, while maintaining electrical isolation. If the leadframe is manufactured with standard chemical etching techniques, the lead ends 28 and paddle perimeter 24 can be as close together as the leadframe is thick, typically 0.127 mm. The paddle perimeter 24 and the lead ends 28 are preferably disposed in a common plane to minimize the thermal path length.

The serpentine shapes of the lead ends 28 and paddle perimeter 24 increase the thermal cross-section between the paddle 22 and leads 26, resulting in more efficient thermal conduction. Thermal cross-section refers to the opposed edge areas of the paddle 21 and lead ends 28, which are typically 0.127 to 0.203 mm thick. For example, in an 8-lead P-DIP and an 8-lead SOIC package, power dissipation can be improved by as much as 35 and 50 percent, respectively.

The IC 21 is attached to the paddle 22 with thermally conductive adhesive (not shown). The paddle 22 and leads 26 are preferably made from electrically and thermally conductive material, such as copper. Electrical connections are made between the IC 21 and the leads 26 with wire bonds 30. The paddle 22, IC 21, and a portion of the leads 26 are encapsulated in a moulding compound 32, preferably a high thermal conductivity material, such as Sumitomo EME5900H.

FIGS. 3a–3d are sectional views of the embodiment of FIG. 2 taken along the section line 3—3, and illustrating different downsetting options for the paddle 22. In operation, heat 34 generated by the IC 21 is transmitted to the paddle 22, and is conducted from the paddle 22 into the moulding compound 32. The large thermal cross-section between the paddle perimeter 24 and the lead ends 28 results in efficient heat transfer between them through the moulding compound 32. The heat is ultimately transmitted to the circuit board (not shown) by the leads 26.

Figure 3B:
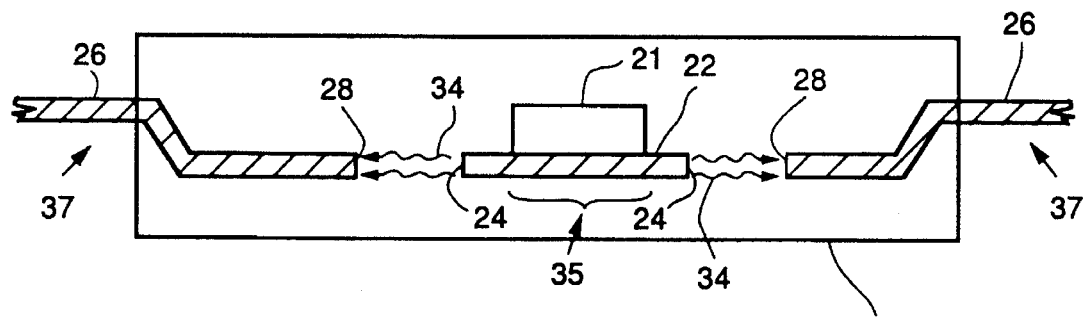
FIGS. 3a–3d are sectional views of the embodiment of FIG. 2 taken along the section line 3—3.
Figure 3C:
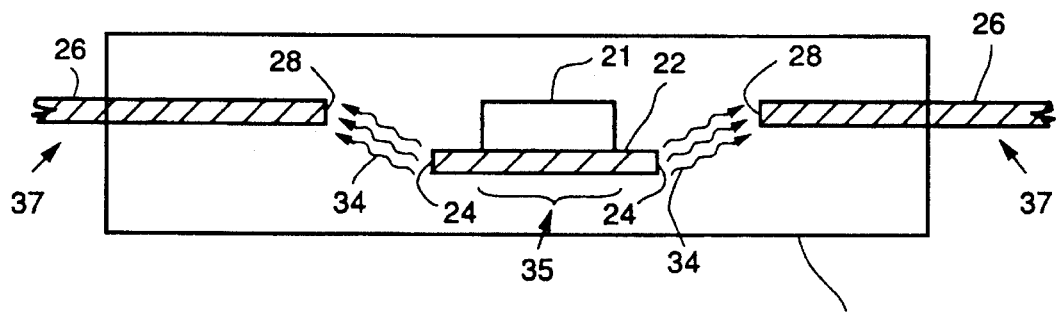
Figure 3D:
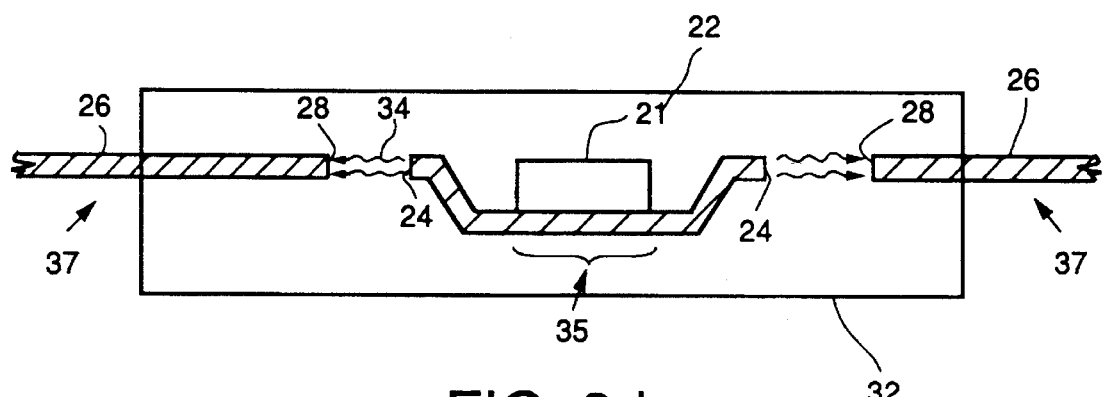
Figure 3A:
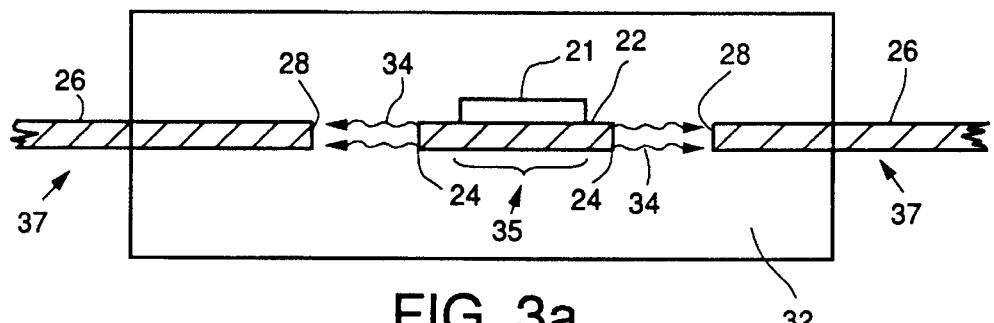

In the embodiments of FIGS. 3a, 3b and 3d, the paddle perimeter 24 and the lead ends 28 are disposed in a common plane to minimize the thermal path length. In the embodiments of FIGS. 3b and 3d, the central paddle portion 35 on which the IC 21 lies is downset with respect to the outer portions 37 of the leads 26, while still maintaining the lead ends 28 and the paddle perimeter 24 on a common plane. The amount of downset can be adjusted to accomodate particular package requirements.

FIG. 3c illustrates a downsetting option in which the entire paddle 22 is downset with respect to the leads 26. The amount of downset used in this embodiment is preferably limited so that the distance between the top of the paddle 22 and the top of the lead ends 28 is no greater than approximately 1.5 times the thickness of the inner lead ends 28 and paddle perimeter 24, so that heat conduction is not compromised. Even though the lead ends 28 and the paddle perimeter 24 are no longer disposed on a common plane, the applicant has found that for a downset equal to 1.0 times the thickness of the leads 26, heat conduction is reduced by only 6 percent when compared to the embodiments of FIGS. 3a, 3b and 3d.

Although the present invention utilizes the leads 26 for heat dissipation, other heat conducting paths are still present. For example, some of the heat conducted into the moulding compound is conducted to the surface of the package, where it is convected by the air.

The specific paddle perimeter shape and lead shapes illustrated in FIG. 2 are not the only shapes that can be used. Any shape that increases the thermal cross-section between the paddle perimeter 24 and the lead ends 28 can be used.

Figure 4A:
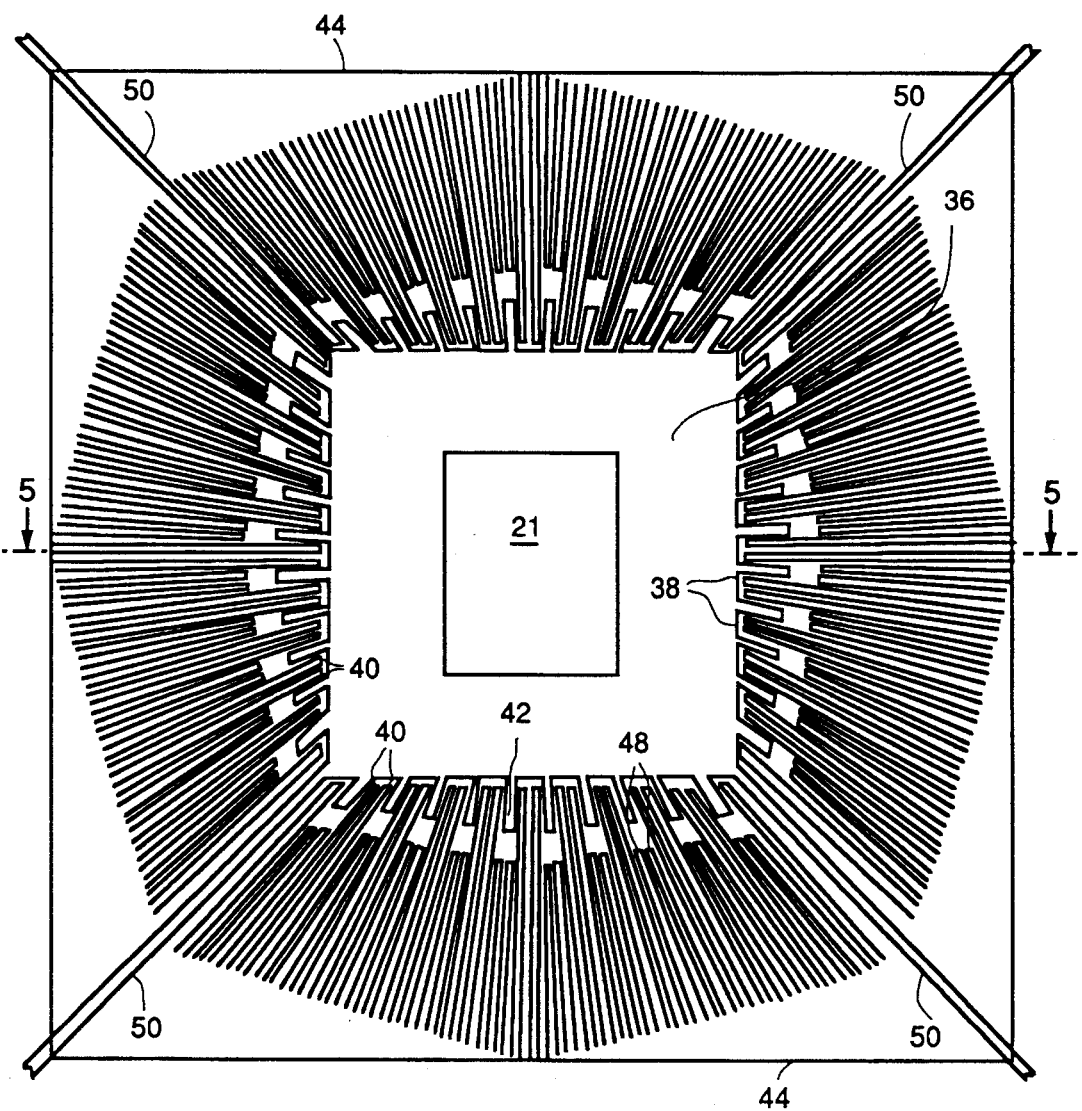
FIG. 4a is a sectional plan view of a 160-lead Quad Flat Pack leadframe incorporating the thermally enhanced paddle and lead finger structure of the present invention.

FIG. 4a illustrates a way of implementing the thermally-enhanced paddle and lead structure in IC packages that utilize a large number of leads, such as a 160-lead QFP. The paddle 36 is designed so that its perimeter 38 contains indentations and generally rectangularly shaped protrusions 42. At least two adjacent leads 40 are extended into each indentation between protrusions 42. The distance between the inner portion of the leads 41 and the paddle perimeter 38 should be as short as existing leadframe manufacturing techniques will allow. With standard chemical etching techniques, the distance can be as short as 0.127 mm.

The shape of the paddle perimeter increases the thermal cross-section between the paddle 36 and the extended leads 40. As with the embodiment of FIG. 2, the leadframe structure of FIG. 4b is encapsulated in a moulding compound 44.

In operation, the moulding compound 44 conducts heat over the short distance between the paddle perimeter 38 and the extended leads 40. As the heat travels along the extended leads 40 towards the circuit board (not shown), some of the heat is conducted to the adjacent shorter leads 48, which help transfer the heat to the circuit board (not shown). As with the embodiment of FIG. 2, heat is also conducted to the surface of the package by the moulding compound 44, where it is convected by the air. As with the embodiments of FIGS.

Figure 5A:
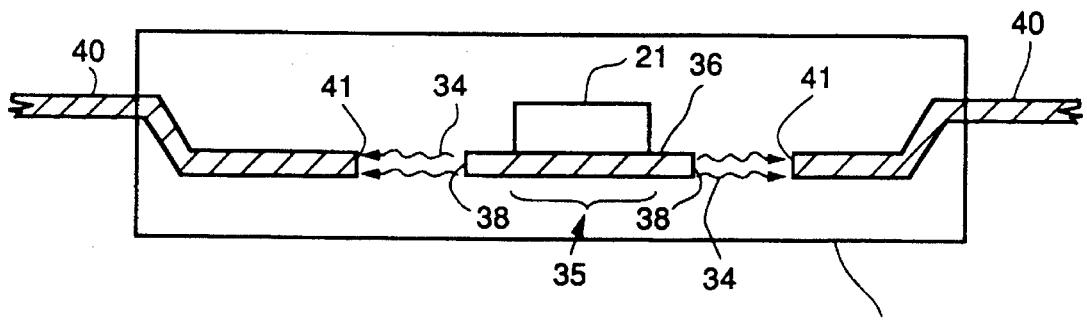
FIGS. 5a–5c are sectional views of the embodiment of FIG. 4b taken along the section line 5—5.
Figure 5B:
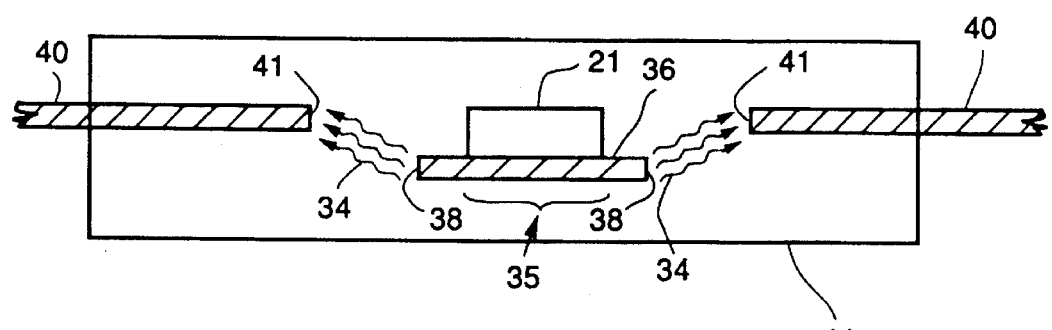
Figure 5C:
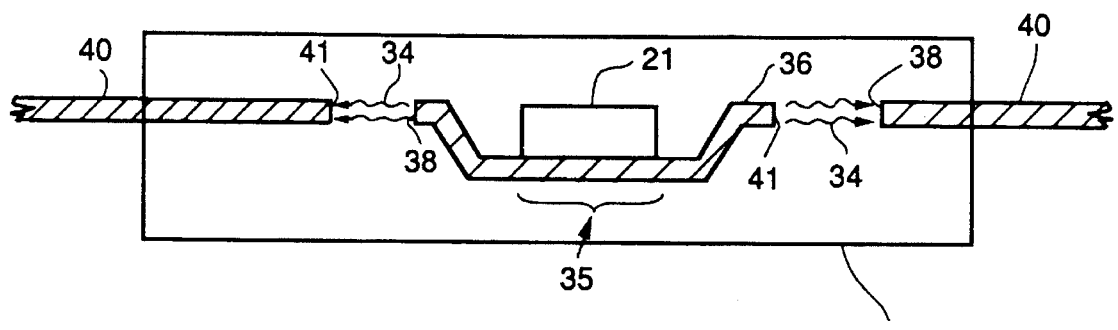

3a–3d, the paddle portion on which the IC 21 lies may be downset with respect to the outer lead portions, as illustrated in FIGS. 5a–5c.

Figure 4B:
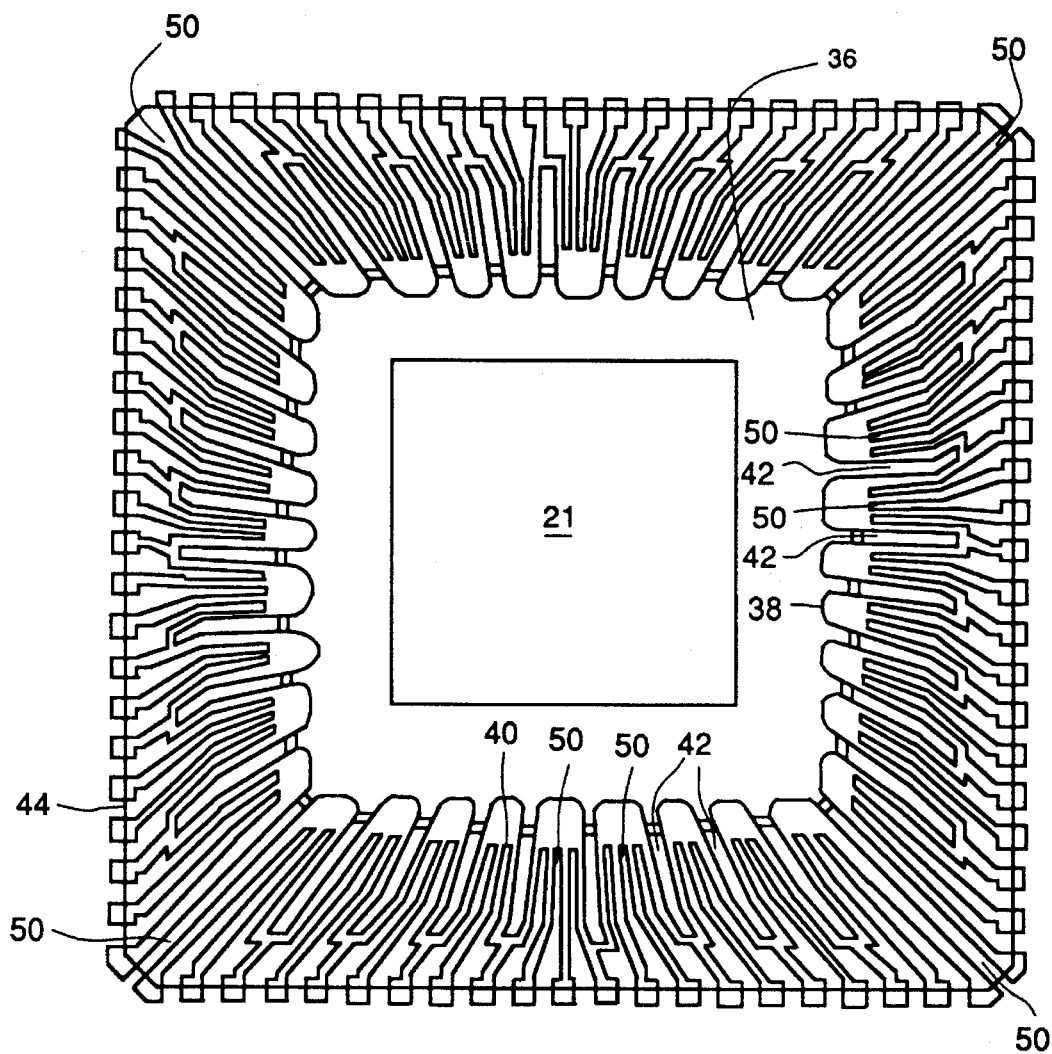
FIG. 4b is a sectional plan view of the 160-lead Quad Flat Pack leadframe of FIG. 4a, illustrating an alternative inner lead portion arrangement.

Although alternating pairs of leads are extended between the protrusions 42 in the embodiment of FIG. 4b, other combinations are possible. For example, FIG. 4b illustrates an embodiment in which all the leads 40 are extended into the indentations, so that there are no short leads. As in the embodiment of FIG. 4a, at least two adjacent leads are extended into each indentation. When more than two adjacent leads are extended into an indentation, the leads 50 that are not directly adjacent to a protrusion 42 receive heat from the surrounding leads, which helps transfer the heat to the circuit board (not shown).

Numerous other variations and alternate embodiments will occur to those skilled in the art without departing from the spirit and scope of the invention. As mentioned above, other paddle perimeter and lead shapes that increase the thermal cross-section between the paddle and the leads could be used. In addition, although 8-lead P-DIP and 160-lead QFP IC packages were used to illustrate the invention, the thermally enhanced leadframe structure can be implemented in any IC package that utilizes a leadframe paddle and multiple leads. Accordingly, it is intended that the invention be limited only in terms of the appended claims.

I claim:

1. A thermally enhanced leadframe structure for supporting an integrated circuit (IC), comprising:

a thermally conductive paddle with a plurality of indentations and generally rectangularly shaped protrusions along its perimeter, and a plurality of electrically and thermally conductive leads arranged to electrically communicate with an IC supported by said paddle, each of said leads having an inner portion that is parallel to at least one of said paddle protrusions, said inner lead portions being positioned so that they lie on a first plane that is in close proximity to a second plane on which said paddle perimeter lies, some of said inner lead portions being longer than the other inner lead portions, the longer inner lead portions substantially extending into respective paddle indentations between paddle protrusions, and the other inner lead portions being generally in-line with respective paddle protrusions and terminating outside said paddle protrusions, wherein said longer inner lead portions are in thermal transfer communication with said paddle perimeter, and at least some of said other inner lead portions are in thermal transfer communication with an adjacent longer inner lead portion, wherein the distance between said first and second planes does not exceed approximately 1.5 times the thickness of said inner lead portions.

2. The structure of claim 1, wherein said inner lead portions comprise alternating pairs of long and short inner lead portions.

3. The structure of claim 1, wherein said first and second planes comprise a common plane.

4. The structure of claim 3, wherein a central portion of said paddle is downset by a predetermined amount with respect to an outer portion of said leads.

5. The structure of claim 4, wherein said outer lead portions, inner lead portions and paddle perimeter lie in substantially the same plane.

6. The structure of claim 4, wherein said outer lead portions lie in a plane that is different than a plane on which said inner lead portions and paddle perimeter lie.

7. The structure of claim 1, wherein the distance between said first and second planes does not exceed approximately 1.5 times the thickness of said inner lead portions and paddle perimeter.

8. The structure of claim 1, wherein the distance between said inner lead portions and said paddle perimeter does not exceed the thickness of said inner lead portions and paddle perimeter.

9. The structure of claim 1, further comprising thermally conductive material between said paddle and said inner lead portions.

10. The structure of claim 9, wherein said thermally conductive material comprises a thermally conductive moulding compound that encapsulates said paddle and a portion of said leads.

* * * * *